Sept. 7, 1965

C. VAN NAMEN, JR

Re. 25,853

TRANSISTOR HEAT SINK

Original Filed March 11, 1959

*INVENTOR.*
CHARLES VAN NAMEN JR.

United States Patent Office

Re. 25,853
Reissued Sept. 7, 1965

25,853
TRANSISTOR HEAT SINK

Charles Van Namen, Jr., Grand Rapids, Mich., assignor, by mesne assignments, to Lear Siegler, Inc., Santa Monica, Calif., a corporation of Delaware Original No. 2,935,666, dated May 3, 1960, Ser. No. 798,770, Mar. 11, 1959. Application for reissue Nov. 20, 1961, Ser. No. 177,143
1 Claim. (Cl. 174—15)

Matter enclosed in heavy brackets [ ] appears in the original patent but forms no part of this reissue specification; matter printed in italics indicates the additions made by reissue.

This invention relates to transistors and more particularly to apparatus for cooling transistors.

Most transistors generate considerable heat while in operation and the heat must be dissipated or the transistor may burn out or otherwise fail to function properly. More specifically, ambient temperature effects can change circuit resistances and cause hysteretic losses. The problem is to dissipate the heat generated by the transistor to obtain uniform, dependable characteristics from the transistor.

One device used in the past was a water cooling system whereby water is kept in contact with the outside of the transistor to dissipate the heat. The disadvantage of this system is that a water jacket around the transistor is required and as a consequence, the resultant unit occupies too much space.

Other methods of cooling the transistor may utilize a blower to circulate air around the transistor, but in aircraft application, the use of blowers adds undesirable weight and space requirements to the aircraft.

It is, therefore, an object of the present invention to provide a heat dissipator for transistors.

It is another object of this invention to provide a heat dissipator for transistors which removes heat from the base of the transistor.

Still another object of the present invention is to provide a snap-on heat dissipator which is relatively inexpensive to manufacture and which occupies a limited amount of space.

Other objects and advantages of the present invention will become apparent from the following description taken in conjunction with the drawings in which.

Figure 1:
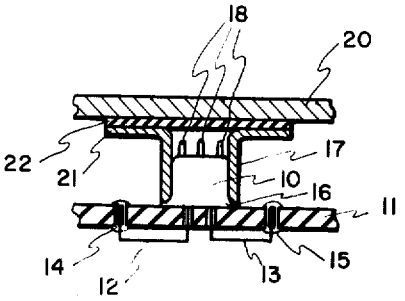
FIG. 1 is a sectional view showing the transistor mounted on the terminal board with a heat sink surrounding the transistor.
Figure 2:
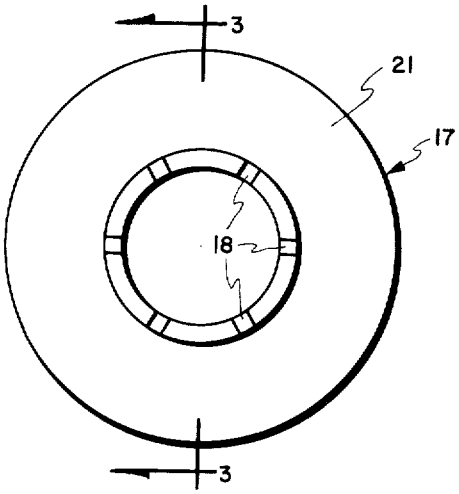
FIG. 2 is an enlarged plan view of the heat sink shown in FIG. 1.
Figure 3:
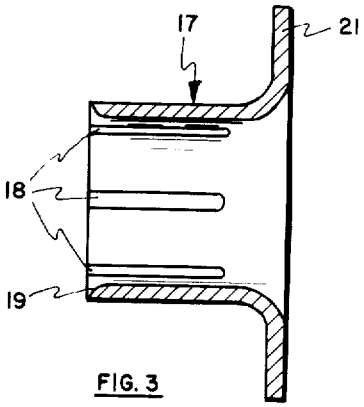
FIG. 3 is a sectional view taken along lines 3—3 in FIG. 2.

Referring now to FIG. 1, there is shown a transistor 10 mounted on a terminal board 11. The leads 12 and 13 of transistor 10 pass through the terminal board 11 and into soldering eyelets 14 and 15. The transistor 10 has a base flange 16 which is normally the hottest portion of the transistor. A heat conductive metallic clip 17 encompasses the transistor 10. The clip 17 has slots 18 therein aligned parallel to the axis of the clip 17 to provide a spring action so that the clip 17 can firmly grasp the transistor 10. The clip 17 is shown with a rounded corner 19 but may be contoured to mate any given base to allow the clip 17 to be snugly fitted against the base 16 of transistor 10 and thermally engage the surface of the transistor. A heat conductive support 20 bears against the flange portion 21 of clip 17 to insure a positive contact between the end of clip 17 and the base 16 of transistor 10. The size of the flange 21 is determined by the heat conductive properties of the material and in general will be varied for correct heat flow. The support 20 and terminal board 11 may be held together by any conventional means, e.g., bolts and spacers.

An electrical insulating material 22, shown enlarged in FIG. 1 to facilitate the description thereof, is positioned between the clip 17 and the support 20. The insulating material 22 may be a relatively thin polyethylene film, e.g., .001 inch thick Mylar available from E. I. du Pont de Nemours & Company, Dupont Building, Wilmington, Delaware. The insulation is used to keep the transistor from being electrically grounded to the support 20 but it is kept sufficiently thin to allow heat to pass from the clip 17 to the support 20. When the insulation is used, the size of the flange 21 is likely to be larger than when an insulation is not used.

It can be seen now that as the transistor heats up, and it is known that the base of the transistor is the hottest, the heat from the base is conducted through the clip 17 to the support 20.

Figure 4:
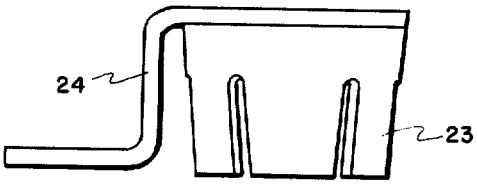
FIG. 4 is an enlarged view of an alternate configuration for a heat sink.

Referring now to FIG. 4, there is shown a clip 23 having a bracket 24 attached thereto. The clip 23 is basically the same as the clip 17 except that the clip 23 is truncated cone-shaped with the cutting plane substantially normal to the axis of the clip and has the attached bracket 24 which may be bolted or otherwise fastened to the terminal board or larger heat sink. This alleviates the need for the support 20 but still insures positive thermal contact between the base 16 of transistor 10 and the clip 23.

Now it can be seen that I have described a transistor heat sink which can be readily manufactured, occupies very little space and yet removes the heat from the hottest point of the transistor.

Although the present invention has been described with a certain degree of particularity, it is understood that various modifications in the details and arrangements of parts may be had without departing from the spirit and scope of the invention as hereinafter claimed.

I claim:

[1. Apparatus for cooling a transistor comprising: a cap having longitudinal slots on the walls of said cap and parallel to the axis of said cap, said cap being contoured to fit snugly around and thermally engage the base of said transistor to provide a conduction path for heat away from the base of said transistor.]

[2. The device as claimed in claim 1 and further comprising: a heat conductive metallic support positioned against one end of said cap to urge said cap in thermal engagement with said base of said transistor and wherein said slotted cap has a flanged portion thermally engaged with said heat conductive metallic support.]

3. Apparatus for cooling a transistor which is mounted between two supports *located in planes which are normal to the axis of said apparatus*, comprising: a cap *with cylindrical walls* having longitudinal slots *extending* through [the] *said* walls [thereof], said cap being contoured to fit snugly around and thermally engage the base of said transistor, said slotted cap having *a circumferentially continuous flanged portion at* one end thereof [flanged] a thin insulating material, said insulating material being positioned between said flange and one of said supports and the other of said supports being positioned to hold a positive contact between said transistor base and said slotted cap.

[4. Transistor cooling means comprising: a slip-on truncated cone-shaped cap contoured to thermally engage the surface of said transistor including the base of said transistor, a heat conductive bracket integral with said cap for connecting said cap to a larger heat sink and further serving to hold said cap against the base of said transistor.]

References Cited by the Examiner

The following references, cited by the Examiner, are of record in the patented file of this patent or the original patent.

UNITED STATES PATENTS

| | | | |
|---|---|---|---|
| 2,820,929 | 1/58 | Coy | 317—234 |
| 2,898,668 | 8/59 | Knott et al. | 29—25.3 |
| 2,917,286 | 12/59 | Deakin | 257—263 |
| 3,020,451 | 2/62 | McAdam | 317—101 |

JOHN F. BURNS, *Primary Examiner.*

JOHN W. HUCKERT, JOHN P. WILDMAN, DARRELL L. CLAY, *Examiners.*